(12) United States Patent
Kellogg (10) Patent No.: US 9,263,877 B1
(45) Date of Patent: Feb. 16, 2016

(54) TEMPERATURE-COMPENSATED CURRENT MONITORING

(71) Applicant: API Technologies Corp., Los Angeles, CA (US)

(72) Inventor: Ian Kellogg, State College, PA (US)

(73) Assignee: API Technologies Corp., Los Angeles, CA (US)

(*) Notice: Subject to any disclaimer, the term of this patent is extended or adjusted under 35 U.S.C. 154(b) by 0 days.

(21) Appl. No.: 14/586,784

(22) Filed: Dec. 30, 2014

(51) Int. Cl.
| | | |
|---|---|---|
| *H02H 5/04* | (2006.01) | |
| *H02H 3/08* | (2006.01) | |
| *H02H 3/04* | (2006.01) | |
| *H05K 7/20* | (2006.01) | |
| *G01K 7/02* | (2006.01) | |
| *G01K 7/16* | (2006.01) | |
| *G01K 7/22* | (2006.01) | |
| *G01R 19/165* | (2006.01) | |
| *H02J 7/00* | (2006.01) | |

(52) U.S. Cl.
CPC .............. *H02H 3/085* (2013.01); *G01K 7/02* (2013.01); *G01K 7/16* (2013.01); *G01K 7/22* (2013.01); *G01R 19/16528* (2013.01); *H02H 3/04* (2013.01); *H05K 7/209* (2013.01); *H02H 5/04* (2013.01); *H02H 5/042* (2013.01); *H02J 2007/0039* (2013.01)

(58) Field of Classification Search
USPC .................................. 361/93.7–93.9, 103
See application file for complete search history.

(56) References Cited

U.S. PATENT DOCUMENTS

| | | | | |
|---|---|---|---|---|
| 5,550,702 | A * | 8/1996 | Schmidt et al. ............... | 361/103 |
| 5,606,483 | A * | 2/1997 | Sawai et al. .................. | 361/106 |
| 5,719,519 | A * | 2/1998 | Berringer ...................... | 327/423 |
| 5,894,394 | A * | 4/1999 | Baba et al. ...................... | 361/87 |
| 6,671,152 | B1 * | 12/2003 | Hersel et al. ................. | 361/93.8 |
| 7,589,490 | B2 * | 9/2009 | Haesters et al. ............. | 318/811 |
| 8,716,634 | B2 * | 5/2014 | Biller ............................ | 219/494 |
| 2013/0002227 | A1 * | 1/2013 | Ikeda et al. ................... | 323/311 |

* cited by examiner

*Primary Examiner* — Danny Nguyen
(74) *Attorney, Agent, or Firm* — Carr & Ferrell LLP (57) ABSTRACT

Systems, methods and media for current monitoring are provided herein. An exemplary method may include: receiving a temperature of a power MOSFET, the temperature being sensed by a temperature sensor; determining a resistance of the power MOSFET using the received temperature; receiving a voltage across the power MOSFET, the voltage being measured by a differential amplifier; calculating a current provided to an electrical load by the power MOSFET using the determined resistance of the power MOSFET and the received voltage; comparing the calculated current to a predetermined threshold; and switching the power MOSFET to an off state in response to the calculated current exceeding the predetermined threshold.

30 Claims, 11 Drawing Sheets

FIG. 8

TEMPERATURE-COMPENSATED CURRENT MONITORING

FIELD OF THE INVENTION

The present technology pertains to monitoring, and more specifically to current monitoring.

BACKGROUND ART

Electricity is essential to electronic devices, such as portable/wearable computer and communications systems, home appliances, entertainment systems, office equipment, industrial robots, server farms/data centers, telecommunications equipment, military systems, marine electronics, and the like. Monitoring the amount of current delivered to a system/load is critical for understanding, for example, the system's impact on battery life, safety decisions in overcurrent protection circuits, the system's health, and establishing system and subsystem power budgets/allowances.

SUMMARY OF THE INVENTION

In some embodiments, the present technology is directed to a system for current monitoring which may include an electrical load; a power MOSFET electrically coupled to the electrical load; a differential amplifier electrically coupled to the power MOSFET; a temperature sensor thermally coupled to the power MOSFET; a processor communicatively coupled to the differential amplifier and the temperature sensor; and a memory communicatively coupled to the processor. The memory mays store instructions executable by the processor to perform a method comprising: receiving a temperature of the power MOSFET, the temperature being sensed by the temperature sensor, determining a resistance of the power MOSFET using the received temperature, receiving a voltage across the power MOSFET, the voltage being measured by the differential amplifier, calculating a current provided to the electrical load by the power MOSFET using the determined resistance of the power MOSFET and the received voltage, comparing the calculated current to a predetermined threshold, and switching the power MOSFET to an off state in response to the calculated current exceeding the predetermined threshold.

In some embodiments, the present technology is directed to a method for monitoring current performed by a processor. The method may include receiving a temperature of a power MOSFET, the temperature being sensed by a temperature sensor; determining a resistance of the power MOSFET using the received temperature; receiving a voltage across the power MOSFET, the voltage being measured by a differential amplifier; calculating a current provided to an electrical load by the power MOSFET using the determined resistance of the power MOSFET and the received voltage; comparing the calculated current to a predetermined threshold; and switching the power MOSFET to an off state in response to the calculated current exceeding the predetermined threshold.

In some embodiments, the present technology is directed to a non-transitory computer-readable storage medium having embodied thereon instructions, the instructions being executable by a processor to perform a method for current monitoring. The method may include receiving a temperature of a power MOSFET, the temperature being sensed by a temperature sensor; determining a resistance of the power MOSFET using the received temperature; receiving a voltage across the power MOSFET, the voltage being measured by a differential amplifier; calculating a current provided to an electrical load by the power MOSFET using the determined resistance of the power MOSFET and the received voltage; comparing the calculated current to a predetermined threshold; and switching the power MOSFET to an off state in response to the calculated current exceeding the predetermined threshold.

BRIEF DESCRIPTION OF THE DRAWINGS

The accompanying drawings, where like reference numerals refer to identical or functionally similar elements throughout the separate views, together with the detailed description below, are incorporated in and form part of the specification, and serve to further illustrate embodiments of concepts that include the claimed disclosure, and explain various principles and advantages of those embodiments. The methods and systems disclosed herein have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein.

DETAILED DESCRIPTION

While this technology is susceptible of embodiment in many different forms, there is shown in the drawings and will herein be described in detail several specific embodiments with the understanding that the present disclosure is to be considered as an exemplification of the principles of the technology and is not intended to limit the technology to the embodiments illustrated. The terminology used herein is for the purpose of describing particular embodiments only and is not intended to be limiting of the technology. As used herein, the singular forms "a," "an," and "the" are intended to include the plural forms as well, unless the context clearly indicates otherwise. It will be further understood that the terms "includes," "including," "comprises," and/or "comprising,"

when used in this specification, specify the presence of stated features, integers, steps, operations, elements, and/or components, but do not preclude the presence or addition of one or more other features, integers, steps, operations, elements, components, and/or groups thereof. It will be understood that like or analogous elements and/or components, referred to herein, may be identified throughout the drawings with like reference characters. It will be further understood that several of the figures are merely schematic representations of the present technology. As such, some of the components may have been distorted from their actual scale for pictorial clarity.

Figure 1A:
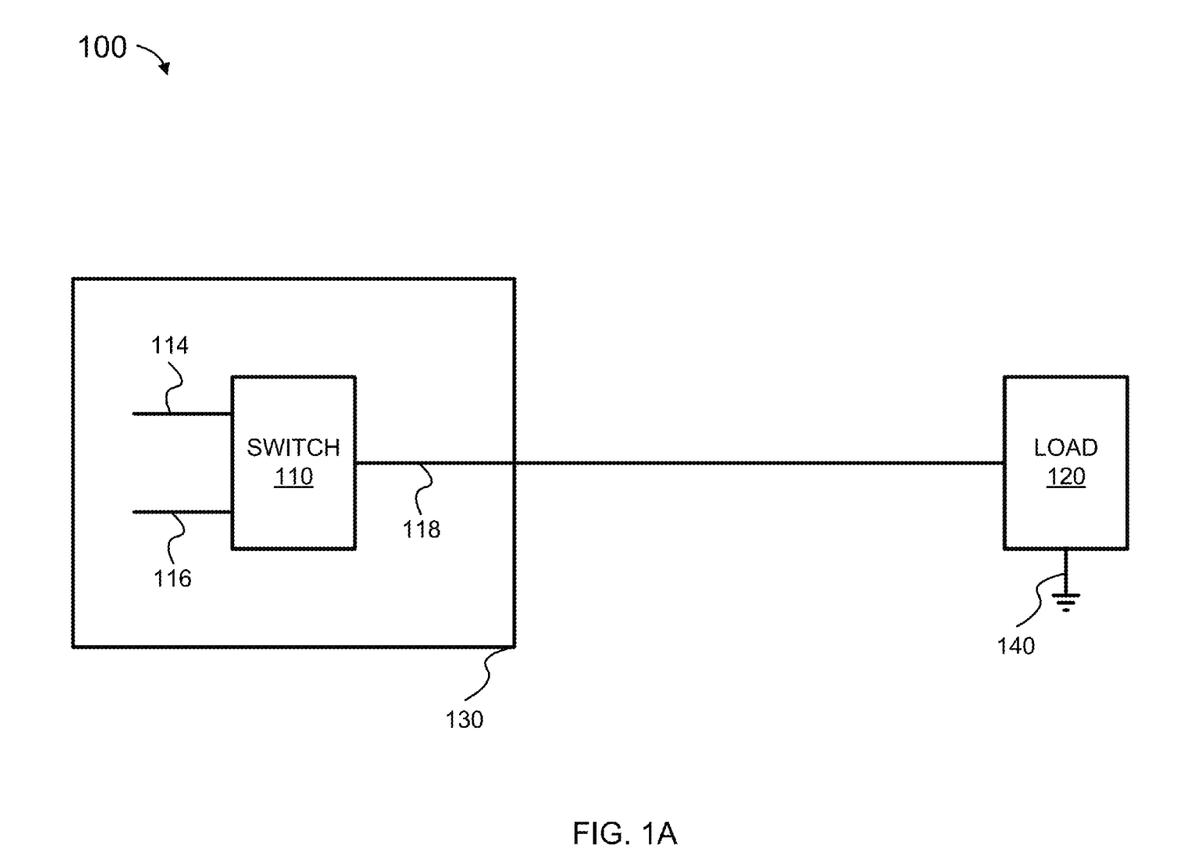
FIG. 1A is a simplified diagram of a system, according to some embodiments.

FIG. 1A shows system 100 including power apparatus 130 and load 120. Power apparatus 130 is electrically coupled to load 120. In some embodiments, power apparatus 130 is, for example, a power supply and/or a power distribution unit. A power supply is an electronic device that supplies electric energy to an electrical load, such as load 120. Power supplies convert one form of electrical energy to another; power supplies may also be referred to as electric power converters. A power distribution unit is an apparatus for distributing and controlling electrical power (e.g., to one or more of load 120) and can include multiple electrical outlets.

Power apparatus 130 may include power filtering, intelligent load balancing, and/or remote monitoring and control (e.g., turning individual loads on and/or off) functions. Power apparatus 130 may further include a main breaker, individual circuit breakers, and power monitoring panel (not illustrated in FIG. 1A). Power apparatus 130 can be in an enclosure (not depicted in FIG. 1A). The enclosure of power apparatus 130 may made of metal and include openings for a power monitoring panel, power input receptacle, and/or power outlets. A power monitoring panel may provide output to a user (e.g., status information, notifications, warnings, etc.) and receive input from the user. For example, the power monitoring panel includes at least some of the features of a computing system described in relation to FIG. 8. An enclosure of power apparatus 130 may include shielding to at least partially block electromagnetic interference (EMI; also called radio-frequency interference (RFI) when in radio frequency).

Power apparatus 130 includes switch 110. Switch 110 can turn on and/or off electrical power provided by power apparatus 130 to load 120. Switch 110 includes three terminals: control input 116, power input 114, and power output 118. Control input 116 controls the operation/state of switch 110 (e.g., "on" and/or "off"). Electrical power is received by switch 110 at power input 114. For example, electrical power received at power input 114 is in the range of 24-32 Volts and 50-150 Amps. Switch 110 may turn on and/or off electrical power provided to load 120 through power output 118. For example, electrical power provided at power output 118 is in the range of 24-32 Volts and 50-150 Amps.

Load 120 is an electrical device which receives electrical power from power apparatus 130. For example, load 120 can be one or more of portable/wearable computer and communications system, home appliance, home entertainment system, office equipment, industrial robot, server (server farm/data center), telecommunications equipment, military systems, marine electronics, avionics, and the like.

Figure 1B:
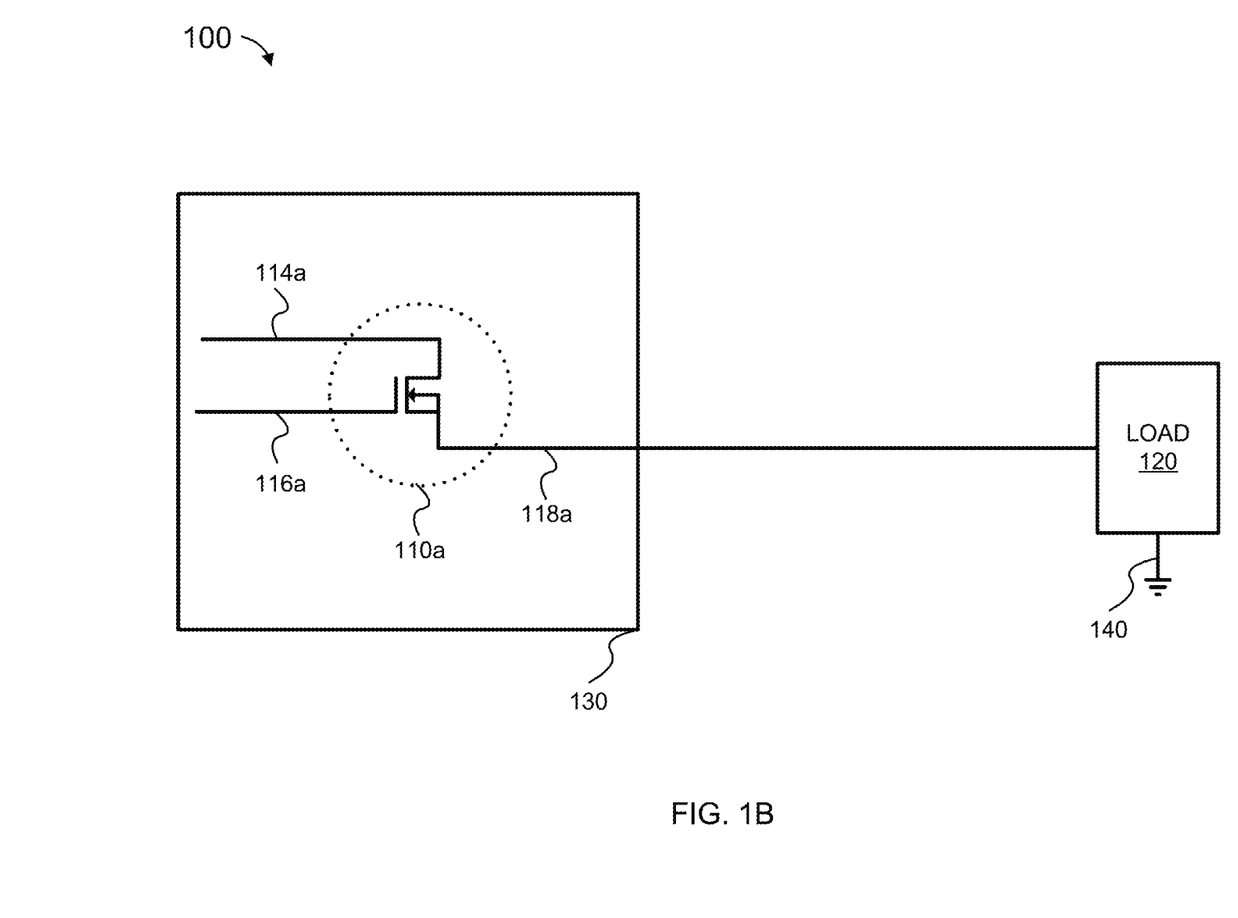
FIG. 1B is a simplified diagram of a system, according to various embodiments.

As shown in FIG. 1B, switch 110 (FIG. 1A) may be a power metal-oxide semiconductor field-effect transistor (MOSFET) 110a. Power MOSFET 110a includes three terminals: drain 114a, gate 116a, and source 118a, which may correspond to power input 114, control input 116, and power output 118 of switch 110, respectively. A power MOSFET is a type of MOSFET designed to handle significant power levels. For example, power MOSFET 110a receives and/or provides electricity in the range of 24-32 Volts and 50-150 Amps. In some embodiments, power provided at source 118a is approximately the same as the power received at drain 114a (e.g., voltage provided at source 118a is based on a voltage received at gate 116a and a drop voltage of a body diode intrinsic to power MOSFET 110a). Power MOSFET 110a is, by way of non-limiting example, an Infineon IPT007N06N. Although MOSFET 110a as depicted in FIG. 1B is an n-channel (nmos or n-type) power MOSFET, various embodiments may use a p-channel (pmos or p-type) power MOSFET.

Drain 114a is electrically coupled to a power or voltage source (not shown in FIG. 1B). Source 118a is electrically coupled to electric load 120. Load 120 is electrically coupled to ground 140. In this way, power MOSFET 110a is in a high-side configuration, source 118a not having a direct connection to ground 140. A low-side configuration, where electric load 120 is coupled to drain 114a and source 118a is coupled to the ground, may also be used.

Figure 6:
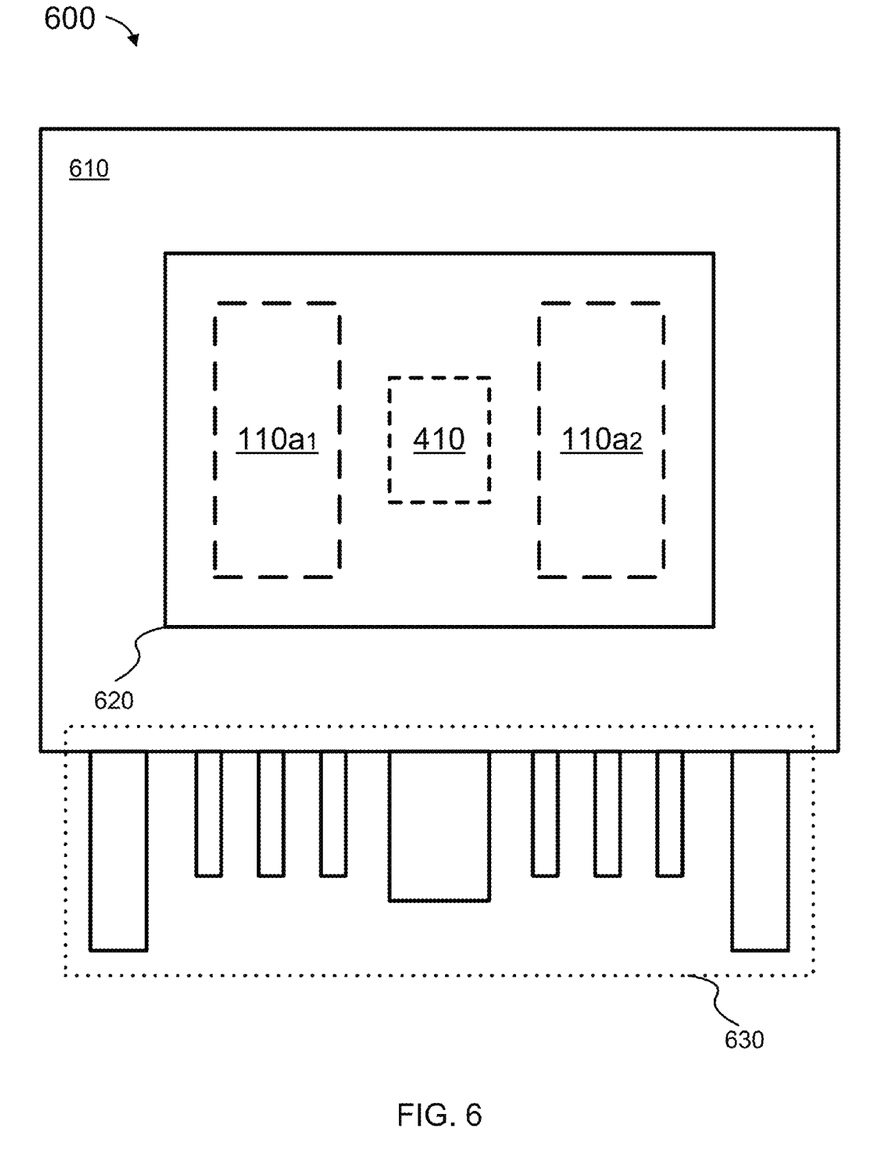
FIG. 6 is a simplified diagram illustrating various aspects of a system for temperature-compensated current monitoring, according to some embodiments.

Various aspects of power apparatus 130, including power MOSFET 110a, according to various embodiments are described further in relation to FIG. 6.

Figure 2:
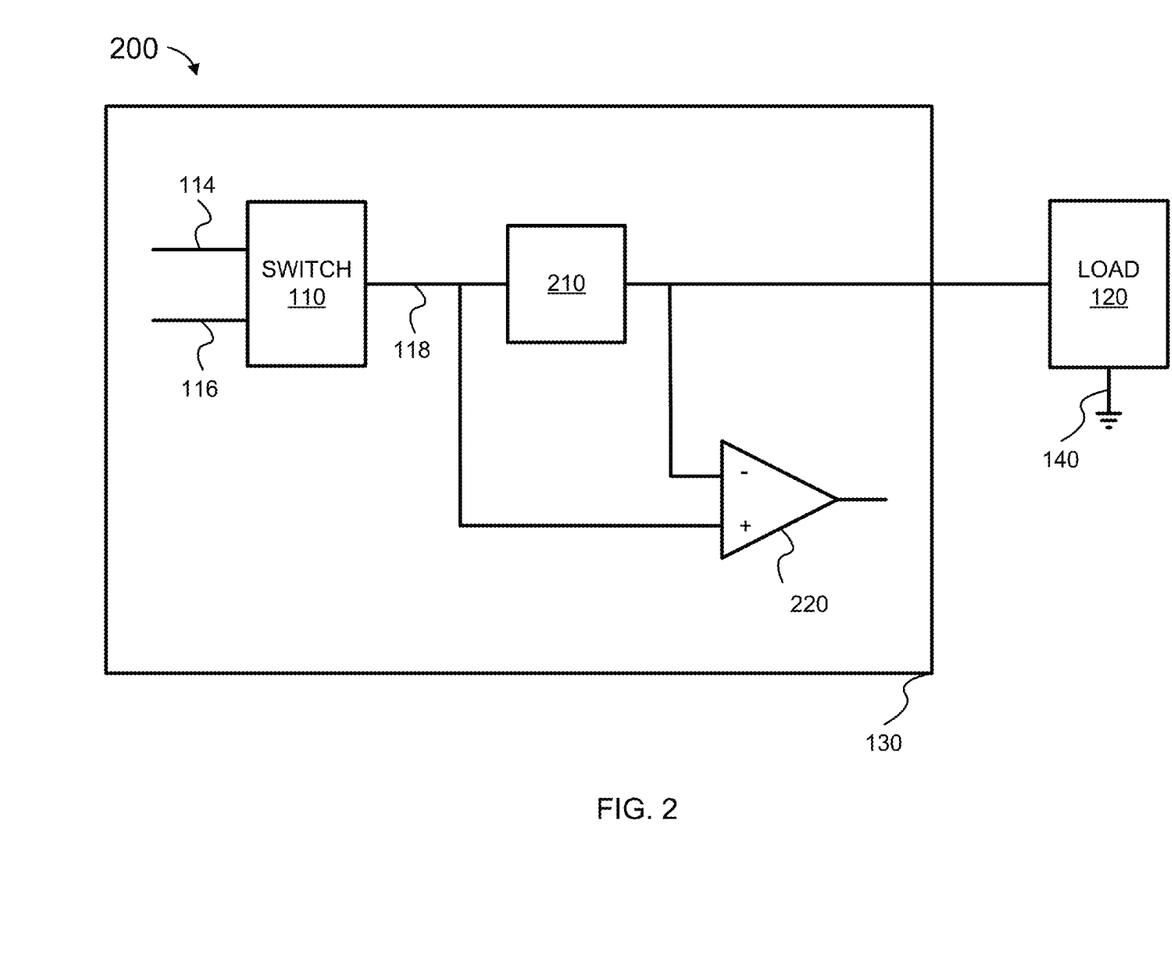
FIG. 2 is a simplified diagram illustrating current monitoring in a system, according to some embodiments.

FIG. 2 depicts system 200 for current monitoring using shunt resistor 210, according to some embodiments. Shunt resistor 210 is disposed between switch 110 and load 120. Since shunt resistor 210 is in series with load 120, a voltage $V_{SHUNT}$ is generated across shunt resistor 210 that is proportional to a current provided to load 120 $I_{LOAD}$. In other words, using Ohm's Law, $I_{LOAD}$ can be determined using the resistance of shunt resistor 210 and $V_{SHUNT}$. Ohm's law states that the current through a conductor between two points is directly proportional to the potential difference across the two points, where a resistance of the conductor is the proportionality term. $V_{SHUNT}$ can be measured by differential amplifier 220. Differential amplifier 220, by way of non-limiting example, is one or more of a current shunt monitor (CSM), operational amplifier (op-amp), difference amplifier (DA), instrumentation amplifier (IA), and the like.

Current monitoring using shunt resistor 210 suffers from the disadvantage of reduced efficiency arising from power loss incurred through shunt resistor 210. For example, a 0.001 Ohms resistance (of shunt resistor 210) will consume 2.5 Watts (producing heat) at 50 Amps. In addition, the additional heat (produced by shunt resistor 210) can shorten the life of electrical devices, including power apparatus 130, so higher costs associated with further thermal management may be incurred.

Figure 3A:
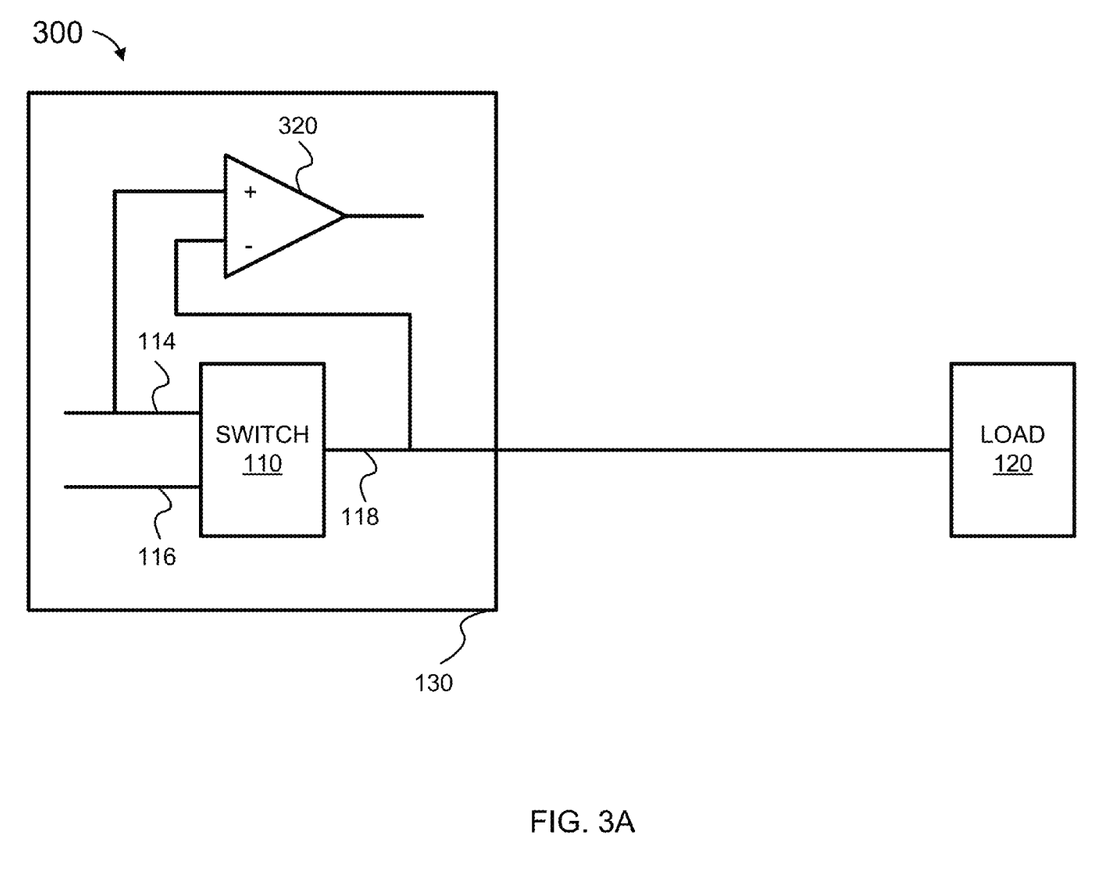
FIG. 3A is a simplified diagram illustrating current monitoring in a system, according to various embodiments.

FIG. 3A illustrates system 300 for current monitoring using a characteristic series resistance of switch 110 (e.g., power MOSFET 110a) $R_{DS}$, according to some embodiments. When MOSFET 110a is conducting (e.g., power is provided to load 120 by power apparatus 130), MOSFET 110a is in a triode region of operation and acts as a linear resistor having resistance $R_{DS}$. For example, $R_{DS}$ is the resistance between drain 114a and source 118a of MOSFET 110a. For example, $V_{DS}$ is the voltage across MOSFET 110a (e.g., voltage across drain 114a and source 118a of MOSFET 110a). $V_{DS}$ can be measured by differential amplifier 320. Differential amplifier 320, by way of non-limiting example, is one or more of a current shunt monitor (CSM), operational amplifier (op-amp), difference amplifier (DA), instrumentation amplifier (IA), and the like. Using Ohm's Law, $I_{LOAD}$ can be determined using $V_{DS}$ and $R_{DS}$.

Figure 3B:
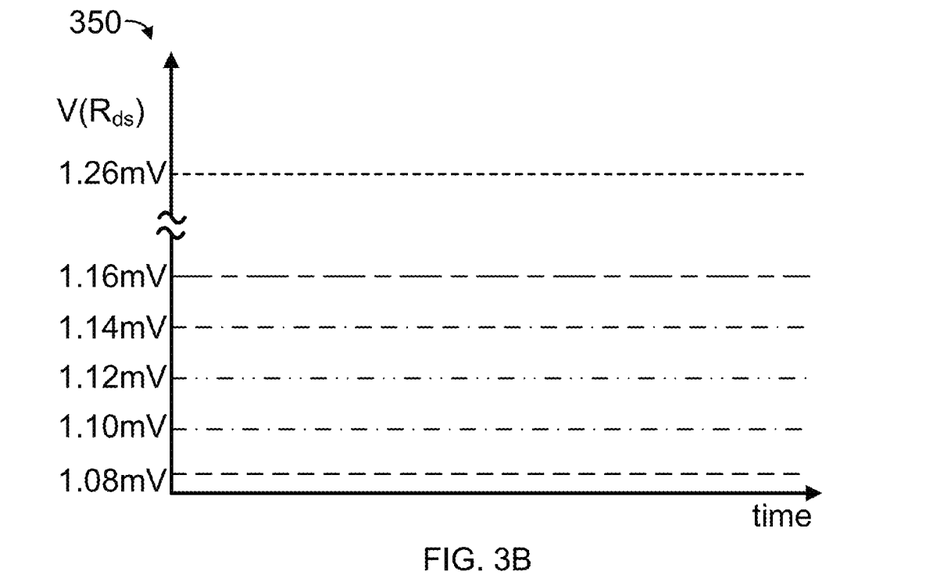
FIG. 3B is a chart illustrating an effect of temperature on a switch characteristic, according to some embodiments.

The $R_{DS}$ of MOSFET 110a is a strong function of temperature. FIG. 3B shows an example graph 350 of $R_{DS}$ over temperature. As shown in FIG. 3B, $R_{DS}$ is from 0.00108 Ohms-0.00126 Ohms over temperatures from −40° C. to +140° C. At lower temperatures $R_{DS}$ is a smaller value and at higher temperatures $R_{DS}$ is a larger value.

Figure 3C:
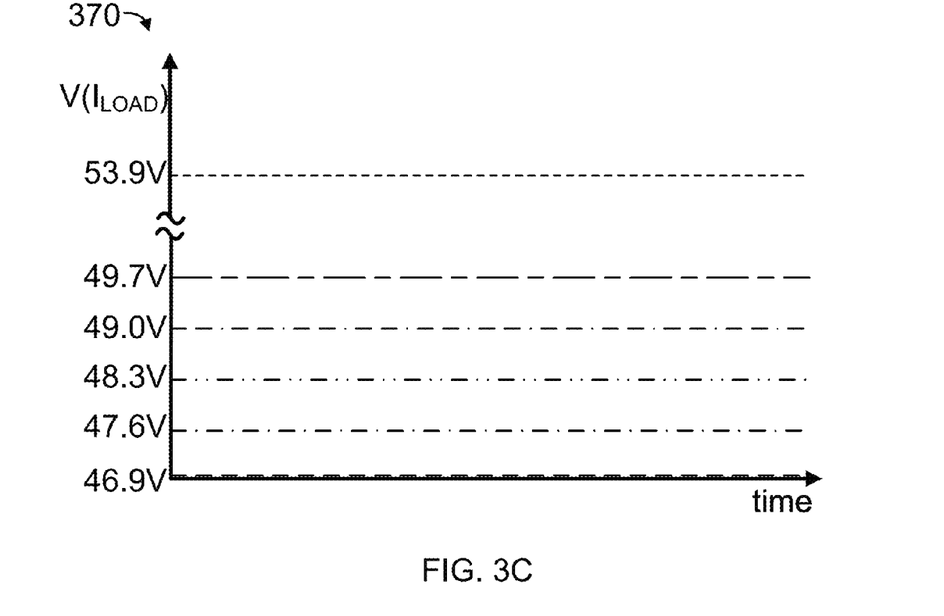
FIG. 3C is a chart illustrating an effect of temperature on current monitoring accuracy, according to some embodiments.

Since $R_{DS}$ changes with temperature, the accuracy of current monitoring—using $R_{DS}$ values based on temperature assumptions—is severely reduced. FIG. 3C shows an example graph 370 of current calculated at temperature from −40° C. to +140° C. For example, the current calculated assuming a 40° C. temperature has only a ±8% accuracy over the −40° C. to +140° C. temperature range.

Figure 3D:
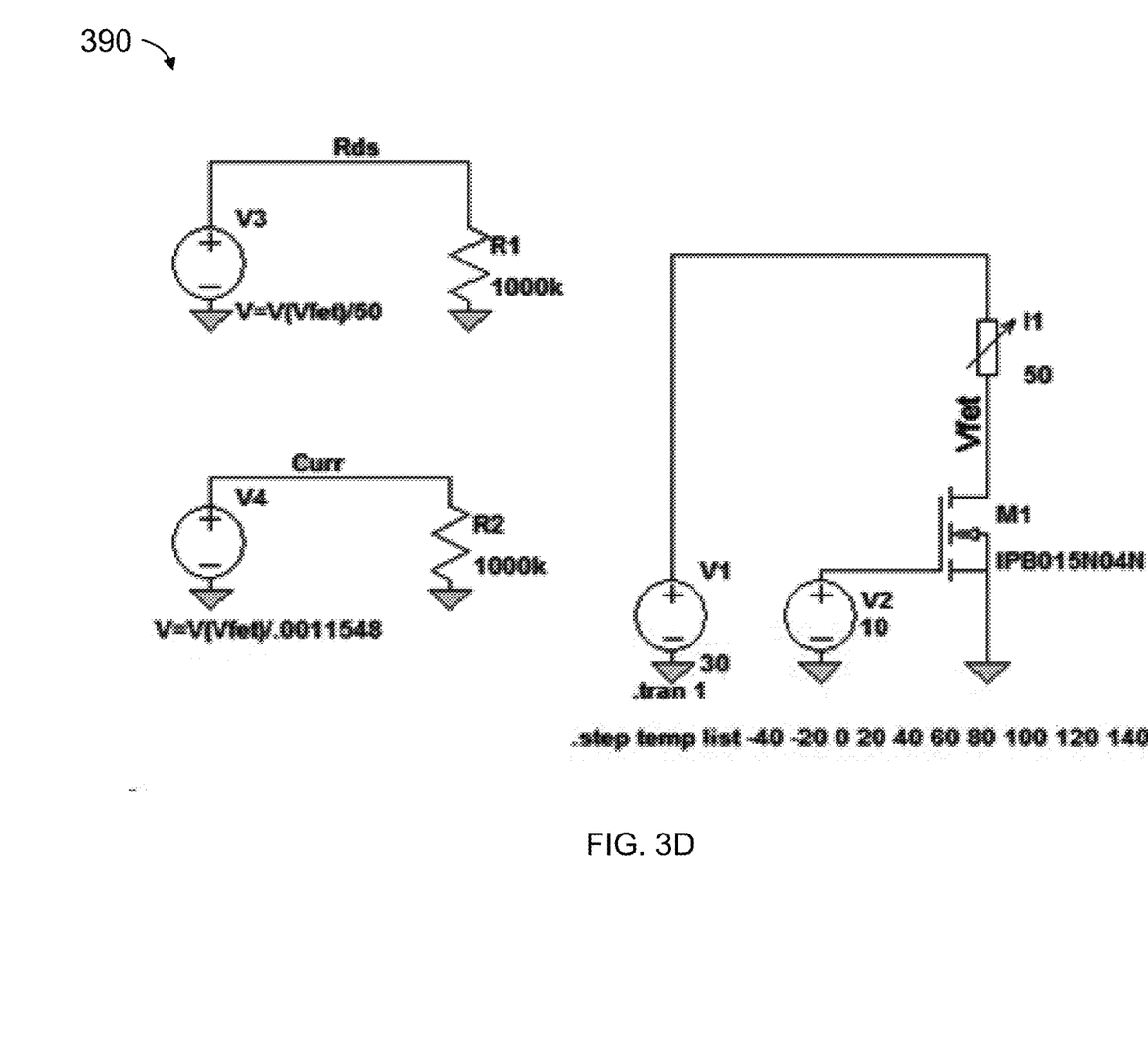
FIG. 3D is a simplified schematic of circuits, according to some embodiments.

FIG. 3D shows a non-limiting example of (simulation) circuits 390 which may be used to determine $R_{DS}$ and $I_{LOAD}$ (e.g., as shown in FIGS. 3B and 3C), according to some embodiments.

Figure 4:
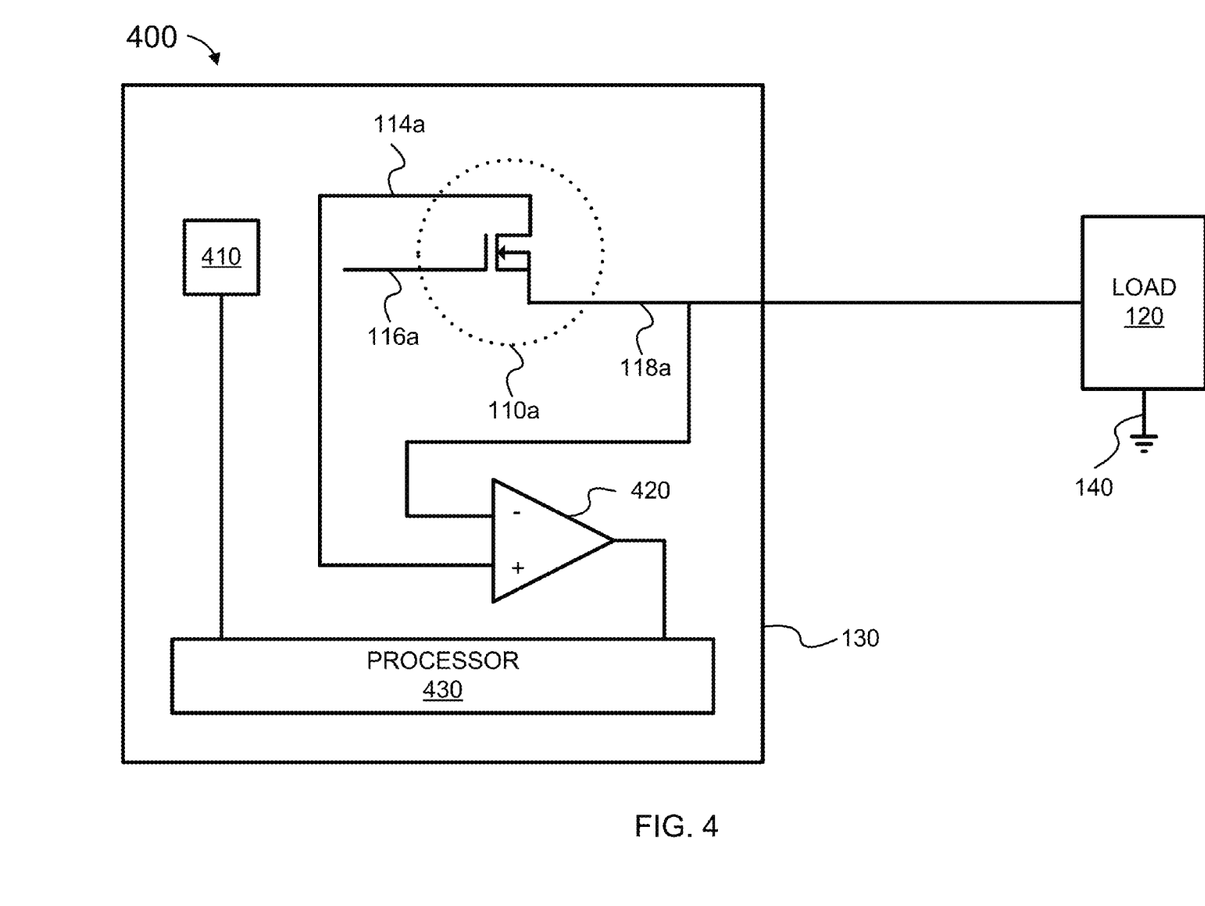
FIG. 4 is a simplified diagram illustrating temperature-compensated current monitoring in a system, according to some embodiments.

FIG. 4 shows system 400 for temperature-compensated current monitoring, including power apparatus 130 and load 120. Power apparatus 130 includes power MOSFET 110a, temperature sensor 410, differential amplifier 420, and processor 430. Temperature sensor 410 is thermally coupled to power MOSFET 110a. Temperature sensor 410 and power MOSFET 110a are described further in relation to FIG. 6. Differential amplifier 420 is electrically coupled to power MOSFET 110a. Processor 430 is communicatively coupled to temperature sensor 410 and differential amplifier 420.

Temperature sensor 410 determines a temperature of power MOSFET 110a. Temperature sensor 410, by way of non-limiting example, is one or more of a thermocouple, resistive temperature device (RTD), thermistor, and integrated silicon-based sensor. Integrated silicon-based sensors may integrate a temperature sensor and signal-conditioning circuitry in a single chip/device. Other temperature sensing technologies may be used, for example, infrared (e.g., pyrometer) and thermal pile. In some embodiments, temperature sensor 410 is an analog temperature sensor that converts temperature to an analog voltage, such as a Microchip Technology Inc. MCP9700A.

Differential amplifier 420 determines $V_{DS}$. For example, differential amplifier 420 is electrically coupled to drain 114a and source 118a of MOSFET 110a. Differential amplifier 420, by way of non-limiting example, is one or more of a current shunt monitor (CSM), operational amplifier (op-amp), difference amplifier (DA), instrumentation amplifier (IA), and the like. In some embodiments, differential amplifier 420 is an LM344 op-amp (e.g., operating in differential mode). By way of non-limiting example, differential amplifier 420 is at least one of a Texas Instruments LMV341, LMV342, and LMV344.

Processor 430 determines $I_{LOAD}$ using signals from temperature sensor 410 and differential amplifier 420. For example, signals from temperature sensor 410 and/or differential amplifier 420 are digital signals representing values for temperature and/or voltage, respectively. Alternatively or additionally, signals from temperature sensor 410 and/or differential amplifier 420 are analog signals including values for temperature and/or voltage, respectively.

Processor 430 may integrate one or more analog-to-digital converters (ADCs; not shown in FIG. 4). ADCs convert a continuous physical quantity (e.g., voltage) to a digital number that represents the quantity's amplitude. Alternatively or additionally, one or more ADCs may be external to processor 430 and be disposed in at least one signal path between processor 430 and at least one of temperature sensor 410 and differential amplifier 420.

In some embodiments, processor 430 is an embedded processor disposed on or in power apparatus 130. For example, processor 430 is an ARM processor, such as a Freescale Kinetis microcontroller (e.g., KL95Z32, KL25Z32, etc.). ARM is a family of instruction set architectures for computer processors based on a reduced instruction set computing (RISC) architecture developed by British company ARM Holdings. By way of further non-limiting example, processor 430 is an embedded processor having at least one of: on-chip RAM, on-chip non-volatile memory, on-chip ADC, on-chip digital-to-analog converter (DAC), and the like. In various embodiments, processor 430 is at least one of: a mobile, desktop, and cloud-based computing system communicatively coupled to power apparatus 130. For example, processor 430 is communicatively coupled to power apparatus 130 through wired and/or wireless networks. Processor 430 and networks are described further in relation to FIG. 8.

The $R_{DS}$ of MOSFET 110a may be determined (e.g., by processor 430) using a temperature measured by temperature sensor 410. For example, a mathematical relationship between a measured temperature and $R_{DS}$ is represented by an empirically derived (e.g., from simulations and/or bench measurements such as reflected in FIGS. 3B and 3C) second-order polynomial.

By way of non-limiting example, the second-order polynomial is:

$$R_{DS} = 6.46229 \times 10^{-9}(\text{Temp})^2 + 2.44568 \times 10^{-6}(\text{Temp}) + 0.000588037 \quad (1)$$

where Temp is the temperature. For example, Equation 1 may be derived using a (simulation) circuit shown in FIG. 3D to apply a constant load of 10 Amps (other loads may be used) over a discrete range temperatures from 20° C.-100° C. (other temperature ranges may be used) to determine corresponding $V_{DS}$ values. $R_{DS}$ values are calculated using the determined $V_{DS}$ values:

$$R_{DS} = V_{DS}/10 \text{ Amps} \quad (2)$$

The calculated $R_{DS}$ values and associated temperature values may be represented by a data plot (of $R_{DS}$ and temperature). A best-fit second-order polynomial for the data plot is determined (e.g., using Mathcad from Parametric Technology Corporation, Excel from Microsoft Corporation, etc.). Multiple measurements at various known temperatures can be taken to empirically determine one or more $R_{DS}$-temperature curves from which one or more best-fit lines may be computed. Once Equation 1 is determined using empirical data, Equation 1 can be used to calculate $R_{DS}$ as a function of temperature (e.g., using temperature sensor 410).

Once $R_{DS}$ is computed using a temperature (e.g., temperature measured by temperature sensor 410) and the best-fit second-order polynomial (e.g., Equation 1), $I_{LOAD}$ (e.g., current provided to load 120 by power apparatus 130) is calculated:

$$I_{LOAD} = V_{DS}/R_{DS} \quad (3)$$

Figure 5:
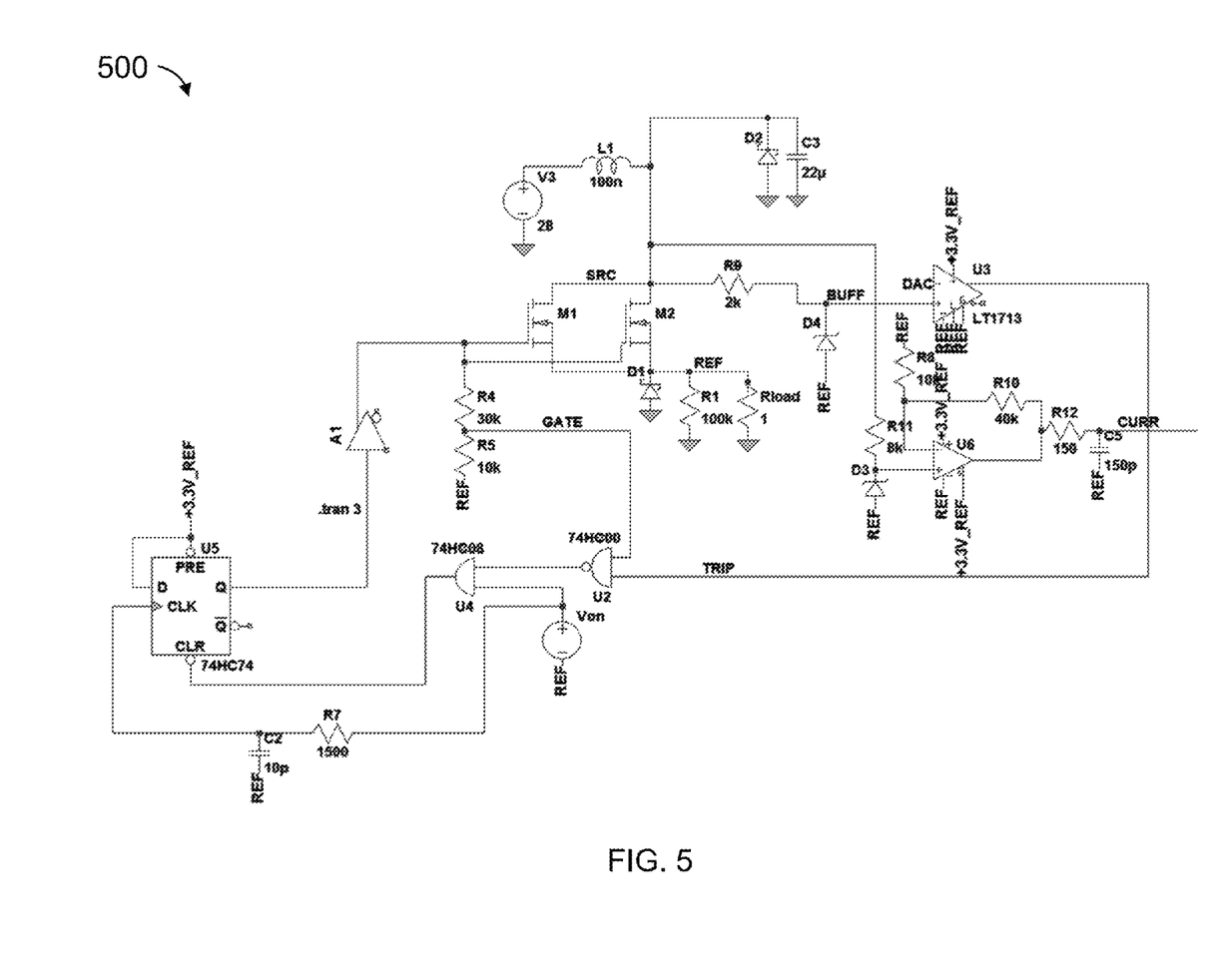
FIG. 5 is a simplified diagram illustrating temperature-compensated current monitoring in a system, according to various embodiments.

FIG. 5 illustrates system 500 for temperature-compensated current monitoring according to various embodiments. As shown in FIG. 5, differential amplifier U6 is a single-ended non-inverting amplifier referenced to the floating source voltage of MOSFETs M1 (and M2). When MOSFETs M1 (and M2) are in the off state, the voltage difference on the inputs of op-amp U6 can be as high as an input voltage (e.g., voltage seen at drain 114a), $V_{IN}$ (e.g., 28 Volts). Since op-amp inputs generally cannot withstand a voltage substantially above its power supply input (e.g., $V_{cc}$), zener diode D3 provides protection. Current limiting resistor R11 can be any value suitable for cancelling op-amp current offset.

By way of non-limiting example, op-amp U6 has a fixed gain of 5× to improve ADC resolution and allow for an increase in $R_{DS}$ that will (at maximum) double the measured voltage. Other gains may be used. In some embodiments, input voltage offset is not trimmed out in hardware but trimmed out in a calibration process as a software offset removal.

Single-ended non-inverting op-amp U6 offers advantages over a differential op-amp when, for example, microcontroller 430 has built in DAC and ADC functions to both read the current and provide a reference voltage for a high-speed comparator (e.g., for handling instant trip protection). In some embodiments where microcontroller 430 does not include DAC and ADC functions, a differential op-amp (e.g., FIG. 4) may be used.

FIG. 6 depicts module 600 of power apparatus 130 (FIGS. 1-4). Module 600 includes two power MOSFETs $110a_1$ and $110a_2$, temperature sensor 410 disposed between MOSFETs $110a_1$ and $110a_2$, and substrate 610. Module 600 includes connectors 630 for physical and electrical connection with other components of power apparatus 130 (not shown in FIG. 6).

In some embodiments, Substrate 610 is a printed circuit board (PCB) comprising one or more metal and dielectric layers. For example, the metal layer is copper and the dielectric layer is at least one of: polytetrafluoroethylene (e.g., Teflon), FR-2 (e.g., phenolic cotton paper), FR-3 (e.g., cotton paper and epoxy), FR-4 (e.g., woven glass and epoxy), FR-5 (e.g., woven glass and epoxy), FR-6 (e.g., matte glass and polyester), G-10 (e.g., woven glass and epoxy), CEM-1 (e.g., cotton paper and epoxy), CEM-2 (e.g., cotton paper and epoxy), CEM-3 (e.g., non-woven glass and epoxy), CEM-4 (e.g., woven glass and epoxy), CEM-5 (e.g., woven glass and polyester), and the like. Connectors 630 may be comprised of at least one of: one or more metal and dielectric layers of substrate 610, metal leads, and an electrical connector.

In some embodiments, heat sink 620 may be mechanically and/or thermally coupled to power MOSFETs $110a_1$ and $110a_2$. For example, heat sink 620 is disposed over a top surface of power MOSFETs $110a_1$ and $110a_2$. The heat sink may be mechanically and thermally coupled to power MOSFETs $110a_1$ and $110a_2$ using one or more of clips, pins, springs, standoffs, thermal tape, epoxy, thermal grease, and the like. Heat sinks are passive heat exchangers that cool power MOSFETs $110a_1$ and $110a_2$ by dissipating heat into the surrounding medium. By way of non-limiting example, heat sink 620 is comprised of at least one of: copper and aluminum alloy. In some embodiments, temperature sensor 410 is thermally coupled to heat sink 620. By way of further non-limiting example, temperature sensor 410 is disposed on or under heat sink 620 and in-between power MOSFETs $110a_1$ and $110a_2$.

Other combinations and permutations may be used in accordance with various embodiments. For example, any number of power MOSFET 110a is included in module 600 (e.g., a single power MOSFET or an array of power MOSFETS); any number of temperature sensor 410 is included in module 600; each of temperature sensor 410 measures temperature for one power MOSFET 110a or more than one power MOSFET 110a; any number of heat sink 620 is included in module 600; each heat sink 620 is thermally coupled to one power MOSFET or more than one power MOSFET 110a; and temperature sensor 410 is disposed on, in, under, or proximate to at least one heat sink 620 and/or proximate to at least one power MOSFET(s) 110a.

Figure 7:
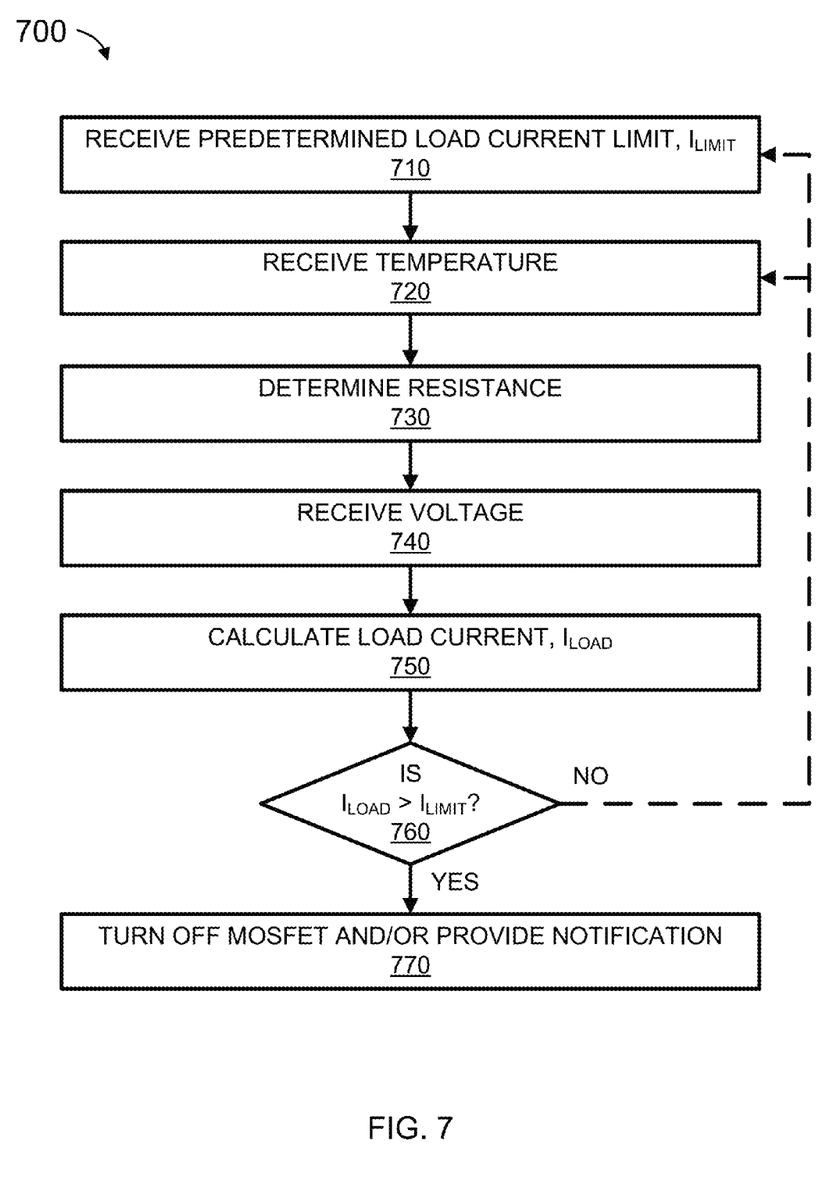
FIG. 7 is a flow diagram of a method for temperature-compensated current monitoring, according to some embodiments.

FIG. 7 illustrates a method 700 for temperature-compensated current monitoring according to some embodiments. In various embodiments, at least some of steps 710-770 are performed by processor 430 (FIG. 4).

At Step 710, a pre-determined current limit $I_{LIMIT}$ is received. For example, $I_{LIMIT}$ is an upper threshold at and/or above which load 120 (FIGS. 1-4) has a condition (marginal condition/poor health, impending failure, and the like). Other current limits may be used, for example, $I_{LIMIT}$ is a lower threshold at and/or below which load 120 has condition, or $I_{LIMIT1}$ is an upper threshold at and/or above which load 120 has a first condition and $I_{LIMIT2}$ is a lower threshold at and/or below which load 120 has a second condition.

At Step 720, a temperature is received. For example, a temperature is an output from temperature sensor 410 (FIGS. 4 and 5) processed by an ADC. In some embodiments, the received temperature is the temperature of one or more power MOSFETs 110a.

At Step 730, resistance $R_{DS}$ is computed. In some embodiments, $R_{DS}$ is computed using the received temperature and a second order polynomial equation (e.g., Equation 1).

At Step 740, voltage $V_{DS}$ is received. For example, $V_{DS}$ is an output from differential amplifier 420 (FIG. 4) and/or op-amp U6 (FIG. 5) processed by an ADC.

At Step 750, current $I_{LOAD}$ is calculated. In some embodiments, $I_{LOAD}$ is calculated using the computed $R_{DS}$, the received $V_{DS}$, and Ohm's Law (e.g., Equation 3).

At Step 760, $I_{LOAD}$ is compared to $I_{LIMIT}$. In some embodiments, whether $I_{LOAD}$ is equal to and/or greater than $I_{LIMIT}$ is determined. Other comparisons may be used, for example, whether $I_{LOAD}$ is equal to and/or greater than $I_{LIMIT}$, or whether $I_{LOAD}$ is equal to and/or greater than $I_{LIMIT1}$ and whether $I_{LOAD}$ is equal to and/or less than $I_{LIMIT2}$. When the comparison condition(s) is not satisfied, method 700 may continue to Step 710 or 720. When the comparison condition(s) is satisfied, method 700 may continue to Step 770.

At Step 770, power MOSFET 110a is switched to an off state (and current removed from load 120) and/or a notification is provided to a user. For example, source 116a is used to turn switch 110a to an off state, at least cutting electrical power to load 120. In some embodiments, the provided notification directs a user to service (e.g., perform preventative maintenance on) load 120. By way of non-limiting example, servicing includes at least one of: inspecting load 120, performing diagnostic tests on load 120, and replacing load 120 with a serviceable unit, averting unscheduled and/or catastrophic interruptions in the operation of system 100, 200, 300, and/or 400 (FIGS. 1-4). In some embodiments, the notification is provided through at least one of a light-emitting diode (LED) on or about power apparatus 130, a power monitoring panel of power apparatus 130 (FIGS. 1-4), in an email, in an SMS message, in a pre-recorded audio message played during an automated telephone call to the user, in an audible alarm of power apparatus 130, and the like.

Various embodiments of the present invention offer one or more of the advantages of higher accuracy for current monitoring, reduced wasted electrical power, and decreased generated heat. In some embodiments, the calculated $I_{LOAD}$—when there is a 10° C. difference between the temperature from temperature sensor 410 (FIG. 4) and a junction temperature of power MOSFET 110a (FIGS. 3 and 4)—is still within 0.8% of an actual $I_{LOAD}$.

Figure 8:
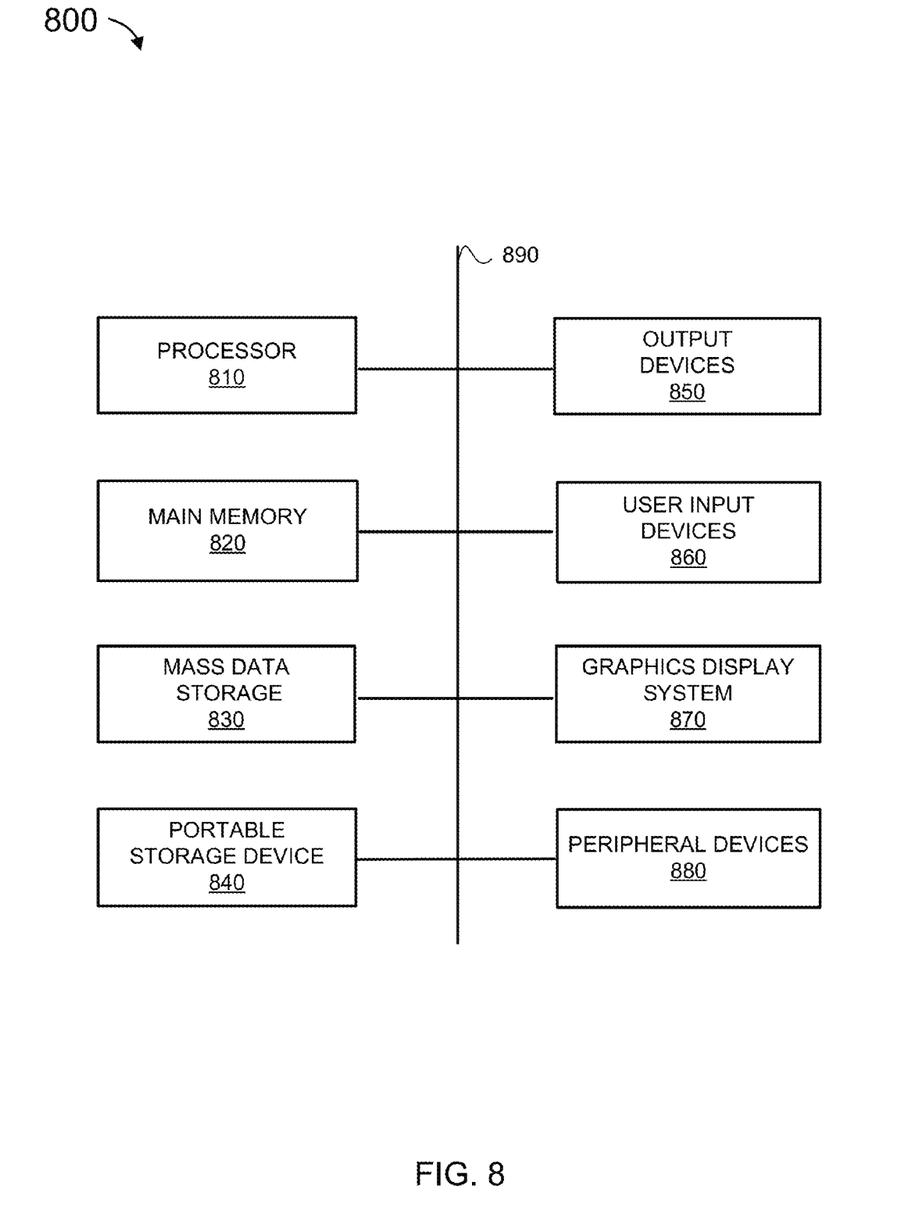
FIG. 8 is a simplified block diagram of a computing system, according to some embodiments.

FIG. 8 illustrates an exemplary computer system 800 that may be used to implement some embodiments of the present invention. The computer system 800 in FIG. 8 may be implemented in the contexts of the likes of computing systems, networks, servers, or combinations thereof. The computer system 800 in FIG. 8 includes one or more processor units 810 and main memory 820. Main memory 820 stores, in part, instructions and data for execution by processor units 810. Main memory 820 stores the executable code when in operation, in this example. The computer system 800 in FIG. 8 further includes a mass data storage 830, portable storage device 840, output devices 850, user input devices 860, a graphics display system 870, and peripheral devices 880.

The components shown in FIG. 8 are depicted as being connected via a single bus 890. The components may be connected through one or more data transport means. Processor unit 810 and main memory 820 is connected via a local microprocessor bus, and the mass data storage 830, peripheral device(s) 880, portable storage device 840, and graphics display system 870 are connected via one or more input/output (I/O) buses.

Mass data storage 830, which can be implemented with a magnetic disk drive, solid state drive, or an optical disk drive, is a non-volatile storage device for storing data and instructions for use by processor unit 810. Mass data storage 830 stores the system software for implementing embodiments of the present disclosure for purposes of loading that software into main memory 820.

Portable storage device 840 operates in conjunction with a portable non-volatile storage medium, such as a flash drive, floppy disk, compact disk, digital video disc, or Universal Serial Bus (USB) storage device, to input and output data and code to and from the computer system 800 in FIG. 8. The system software for implementing embodiments of the present disclosure is stored on such a portable medium and input to the computer system 800 via the portable storage device 840.

User input devices 860 can provide a portion of a user interface. User input devices 860 may include one or more microphones, an alphanumeric keypad, such as a keyboard, for inputting alphanumeric and other information, or a pointing device, such as a mouse, a trackball, stylus, or cursor direction keys. User input devices 860 can also include a touchscreen. Additionally, the computer system 800 as shown in FIG. 8 includes output devices 850. Suitable output devices 850 include speakers, printers, network interfaces, and monitors.

Graphics display system 870 include a liquid crystal display (LCD) or other suitable display device. Graphics display system 870 is configurable to receive textual and graphical information and processes the information for output to the display device.

Peripheral devices 880 may include any type of computer support device to add additional functionality to the computer system.

The components provided in the computer system 800 in FIG. 8 are those typically found in computer systems that may be suitable for use with embodiments of the present disclosure and are intended to represent a broad category of such computer components that are well known in the art. Thus, the computer system 800 in FIG. 8 can be a personal computer (PC), hand held computer system, telephone, mobile computer system, workstation, tablet, phablet, mobile phone, server, minicomputer, mainframe computer, wearable, or any other computer system. The computer may also include different bus configurations, networked platforms, multi-processor platforms, and the like. Various operating systems may be used including UNIX, LINUX, WINDOWS, MAC OS, PALM OS, QNX ANDROID, IOS, CHROME, and other suitable operating systems.

Some of the above-described functions may be composed of instructions that are stored on storage media (e.g., computer-readable medium). The instructions may be retrieved and executed by the processor. Some examples of storage media are memory devices, tapes, disks, and the like. The instructions are operational when executed by the processor to direct the processor to operate in accord with the technology. Those skilled in the art are familiar with instructions, processor(s), and storage media.

In some embodiments, the computing system 800 may be implemented as a cloud-based computing environment, such as a virtual machine operating within a computing cloud. In other embodiments, the computing system 800 may itself include a cloud-based computing environment, where the functionalities of the computing system 800 are executed in a distributed fashion. Thus, the computing system 800, when configured as a computing cloud, may include pluralities of computing devices in various forms, as will be described in greater detail below.

In general, a cloud-based computing environment is a resource that typically combines the computational power of a large grouping of processors (such as within web servers) and/or that combines the storage capacity of a large grouping of computer memories or storage devices. Systems that provide cloud-based resources may be utilized exclusively by their owners or such systems may be accessible to outside users who deploy applications within the computing infrastructure to obtain the benefit of large computational or storage resources.

The cloud is formed, for example, by a network of web servers that comprise a plurality of computing devices, such as the computing system 800, with each server (or at least a plurality thereof) providing processor and/or storage resources. These servers manage workloads provided by multiple users (e.g., cloud resource customers or other users). Typically, each user places workload demands upon the cloud that vary in real-time, sometimes dramatically. The nature and extent of these variations typically depends on the type of business associated with the user.

It is noteworthy that any hardware platform suitable for performing the processing described herein is suitable for use with the technology. The terms "computer-readable storage medium" and "computer-readable storage media" as used herein refer to any medium or media that participate in providing instructions to a CPU for execution. Such media can take many forms, including, but not limited to, non-volatile media, volatile media and transmission media. Non-volatile media include, for example, optical, magnetic, and solid-state disks, such as a fixed disk. Volatile media include dynamic memory, such as system RAM. Transmission media include coaxial cables, copper wire and fiber optics, among others, including the wires that comprise one embodiment of a bus. Transmission media can also take the form of acoustic or light waves, such as those generated during radio frequency (RF) and infrared (IR) data communications. Common forms of computer-readable media include, for example, a floppy disk, a flexible disk, a hard disk, magnetic tape, any other magnetic medium, a CD-ROM disk, digital video disk (DVD), any other optical medium, any other physical medium with patterns of marks or holes, a RAM, a PROM, an EPROM, an EEPROM, a FLASH memory, any other memory chip or data exchange adapter, a carrier wave, or any other medium from which a computer can read.

Various forms of computer-readable media may be involved in carrying one or more sequences of one or more instructions to a CPU for execution. A bus carries the data to system RAM, from which a CPU retrieves and executes the instructions. The instructions received by system RAM can optionally be stored on a fixed disk either before or after execution by a CPU.

Computer program code for carrying out operations for aspects of the present technology may be written in any combination of one or more programming languages, including an object oriented programming language such as JAVA, SMALLTALK, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The corresponding structures, materials, acts, and equivalents of all means or step plus function elements in the claims below are intended to include any structure, material, or act for performing the function in combination with other claimed elements as specifically claimed. The description of the present technology has been presented for purposes of illustration and description, but is not intended to be exhaustive or limited to the invention in the form disclosed. Many modifications and variations will be apparent to those of ordinary skill in the art without departing from the scope and spirit of the invention. Exemplary embodiments were chosen and described in order to best explain the principles of the present technology and its practical application, and to enable others of ordinary skill in the art to understand the invention for various embodiments with various modifications as are suited to the particular use contemplated.

Aspects of the present technology are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments of the present technology. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the present technology has been described in connection with a series of preferred embodiment, these descriptions are not intended to limit the scope of the technology to the particular forms set forth herein. It will be further understood that the methods of the technology are not necessarily limited to the discrete steps or the order of the steps described. To the contrary, the present descriptions are intended to cover such alternatives, modifications, and equivalents as may be included within the spirit and scope of the technology as defined by the appended claims and otherwise appreciated by one of ordinary skill in the art.

What is claimed is:

1. A system for monitoring current comprising:
an electrical load;
a power MOSFET electrically coupled to the electrical load;
a differential amplifier electrically coupled to the power MOSFET;
a temperature sensor thermally coupled to the power MOSFET;
a processor communicatively coupled to the differential amplifier and the temperature sensor; and
a memory communicatively coupled to the processor, the memory storing instructions executable by the processor to perform a method comprising:
receiving a temperature of the power MOSFET, the temperature being sensed by the temperature sensor, the receiving the temperature of the power MOSFET including:
receiving an analog voltage from the temperature sensor, the analog voltage representing the temperature of the power MOSFET, and
converting the analog voltage to a digital number by an analog to digital converter, the digital number representing the temperature of the power MOSFET,
determining a resistance of the power MOSFET using the digital number representing the temperature,
receiving a voltage across the power MOSFET, the voltage being measured by the differential amplifier,
calculating a current provided to the electrical load by the power MOSFET using the determined resistance of the power MOSFET and the received voltage,
comparing the calculated current to a predetermined threshold, and
switching the power MOSFET to an off state in response to the calculated current exceeding the predetermined threshold.

2. The system of claim 1 further comprising:
a display, the display providing a notification to a user.

3. The system of claim 1 further comprising:
a substrate, the power MOSFET and the temperature sensor being disposed on the substrate.

4. The system of claim 1 further comprising:
a heat sink, the heatsink being thermally coupled to the power MOSFET and the temperature sensor.

5. The system of claim 1 wherein the method further comprises:
providing a notification to a user in response to the calculated current exceeding the predetermined threshold, the notification directing the user to service the electrical load.

6. The system of claim 1 wherein the power MOSFET is an n-type MOSFET.

7. The system of claim 6 wherein the power MOSFET is in a high-side configuration.

8. The system of claim 1 wherein the power MOSFET is a p-type MOSFET.

9. The system of claim 1 wherein the differential amplifier is a single-ended non-inverting op-amp operating.

10. The system of claim 1 wherein the differential amplifier is at least one of a current shunt monitor (CSM), difference amplifier (DA), and instrumentation amplifier (IA).

11. The system of claim 1 wherein the temperature sensor is an integrated silicon-based sensor.

12. The system of claim 1 wherein the temperature sensor is at least one of a thermocouple, resistive temperature device (RTD), and thermistor.

13. A method for current monitoring by a processor comprising:
receiving a temperature of a power MOSFET, the temperature being sensed by a temperature sensor, the receiving the temperature of the power MOSFET including:
receiving an analog voltage from the temperature sensor, the analog voltage representing the temperature of the power MOSFET, and
converting the analog voltage to a digital number by an analog to digital converter, the digital number representing the temperature of the power MOSFET;
determining a resistance of the power MOSFET using the digital number representing the temperature;
receiving a voltage across the power MOSFET, the voltage being measured by a differential amplifier;
calculating a current provided to an electrical load by the power MOSFET using the determined resistance of the power MOSFET and the received voltage;
comparing the calculated current to a predetermined threshold; and
switching the power MOSFET to an off state in response to the calculated current exceeding the predetermined threshold.

14. The method of claim 13 wherein determining the resistance of the power MOSFET includes using the digital number representing the temperature to evaluate a second order polynomial.

15. The method of claim 13 wherein calculating the current includes using the determined resistance of the power MOSFET and the received voltage to evaluate Ohm's Law.

16. The method of claim 13 further comprising:
providing a notification to a user in response to the calculated current exceeding the predetermined threshold, the notification directing the user to service the electrical load.

17. A system for monitoring current comprising:
an electrical load;
a power MOSFET electrically coupled to the electrical load;
a differential amplifier electrically coupled to the power MOSFET;
a temperature sensor thermally coupled to the power MOSFET;
a processor communicatively coupled to the differential amplifier and the temperature sensor; and
a memory communicatively coupled to the processor, the memory storing instructions executable by the processor to perform a method comprising:
receiving a temperature of the power MOSFET, the temperature being sensed by the temperature sensor,
determining a resistance of the power MOSFET using the received temperature,
receiving a voltage across the power MOSFET, the voltage being measured by the differential amplifier, the receiving the voltage across the power MOSFET including:
receiving an analog voltage from the differential amplifier, the analog voltage representing the temperature of the power MOSFET, and
converting the analog voltage to a digital number by an analog to digital converter, the digital number representing the voltage across the power MOSFET,
calculating a current provided to the electrical load by the power MOSFET using the determined resistance of the power MOSFET and the digital number representing the voltage,
comparing the calculated current to a predetermined threshold, and
switching the power MOSFET to an off state in response to the calculated current exceeding the predetermined threshold.

18. The system of claim 17 further comprising:
a display, the display providing a notification to a user.

19. The system of claim 17 further comprising:
a substrate, the power MOSFET and the temperature sensor being disposed on the substrate.

20. The system of claim 17 further comprising:
a heat sink, the heat sink being thermally coupled to the power MOSFET and the temperature sensor.

21. The system of claim 17 wherein the method further comprises:
providing a notification to a user in response to the calculated current exceeding the predetermined threshold, the notification directing the user to service the electrical load.

22. The system of claim 17 wherein the power MOSFET is an n-type MOSFET.

23. The system of claim 22 wherein the power MOSFET is in a high-side configuration.

24. The system of claim 17 wherein the power MOSFET is a p-type MOSFET.

25. The system of claim 17 wherein the differential amplifier is a single-ended non-inverting op-amp operating.

26. The system of claim 17 wherein the differential amplifier is at least one of a current shunt monitor (CSM), difference amplifier (DA), and instrumentation amplifier (IA).

27. The system of claim 17 wherein the temperature sensor is at least one of an integrated silicon-based sensor, thermocouple, resistive temperature device (RTD), and thermistor.

28. A method for current monitoring by a processor comprising:
receiving a temperature of a power MOSFET, the temperature being sensed by a temperature sensor;
determining a resistance of the power MOSFET using the received temperature;

receiving a voltage across the power MOSFET, the voltage being measured by a differential amplifier, the receiving the voltage across the power MOSFET including:
  receiving an analog voltage from the differential amplifier, the analog voltage representing the temperature of the power MOSFET, and
  converting the analog voltage to a digital number by an analog to digital converter, the digital number representing the voltage across the power MOSFET;
calculating a current provided to an electrical load by the power MOSFET using the determined resistance of the power MOSFET and the digital number representing the voltage;
comparing the calculated current to a predetermined threshold; and
switching the power MOSFET to an off state in response to the calculated current exceeding the predetermined threshold.

29. The method of claim 28 wherein determining the resistance of the power MOSFET includes using the received temperature to evaluate a second order polynomial.

30. The method of claim 28 wherein calculating the current includes using the determined resistance of the power MOSFET and the digital number representing the voltage to evaluate Ohm's Law.

* * * * *